United States Patent
Garrett

(10) Patent No.: US 7,437,657 B2
(45) Date of Patent: Oct. 14, 2008

(54) HIGH SPEED ADD-COMPARE-SELECT PROCESSING

(75) Inventor: David Garrett, Pyrmont (AU)

(73) Assignee: Lucent Technologies Inc., Murray Hill, NJ (US)

( * ) Notice: Subject to any disclaimer, the term of this patent is extended or adjusted under 35 U.S.C. 154(b) by 1077 days.

(21) Appl. No.: 10/211,688

(22) Filed: Aug. 2, 2002

(65) Prior Publication Data

US 2003/0028846 A1   Feb. 6, 2003

(51) Int. Cl.
*H03M 13/03* (2006.01)
(52) U.S. Cl. .................................................. 714/792
(58) Field of Classification Search ................. 714/792, 714/795, 796, 819, 820, 824, 757; 708/523; 375/341
See application file for complete search history.

(56) References Cited

U.S. PATENT DOCUMENTS

| | | | | |
|---|---|---|---|---|
| 4,757,506 A * | 7/1988 | Heichler | .................... | 714/795 |
| 5,027,374 A * | 6/1991 | Rossman | .................... | 375/341 |
| 5,220,570 A * | 6/1993 | Lou et al. | .................... | 714/791 |
| 5,377,133 A * | 12/1994 | Riggle et al. | ................ | 708/524 |
| 5,987,490 A * | 11/1999 | Alidina et al. | ............... | 708/523 |
| 6,396,878 B1 * | 5/2002 | Piirainen | .................... | 375/262 |
| 2002/0147755 A1 * | 10/2002 | Bhushan et al. | ............. | 708/671 |

* cited by examiner

*Primary Examiner*—Jacques Louis-Jacques
*Assistant Examiner*—Fritz Alphonse

(57) ABSTRACT

A method and apparatus for performing add-compare-select processing using carry-save arithmetic. Data compressors that operate based upon carry-save principles are utilized to render the correct result without requiring intermediate results to be resolved. Intermediate results are truncated to ensure that the dynamic range of the add-compare-select unit is not exceeded, whilst ensuring that the resolution of the intermediate results is not adversely affected. The computation of two competing paths is delayed and only the difference is computed directly, resulting in a reduction of the propagation path through the add-compare-select unit.

7 Claims, 9 Drawing Sheets

| A | B | C | Carry | Sum |
|---|---|---|-------|-----|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

HIGH SPEED ADD-COMPARE-SELECT PROCESSING

CROSS-REFERENCE TO RELATED APPLICATION

This application claims priority of Australian Provisional Application No. PR6794, which filed on Aug. 3, 2001.

BACKGROUND OF THE INVENTION

I. Field of the Invention

The present invention relates generally to decoding in communication systems and, more particularly, to add-compare-select (ACS) processing.

II. Description of the Related Art

A major portion of the processing power for third generation wireless communications revolves around trellis-based ("butterfly") algorithms, such as the log domain maximum a posteriori (log MAP) algorithm or the Viterbi algorithm (VA).

A trellis butterfly calculation defines the interconnectivity between two states in a trellis at a present time and two states in the trellis in a next time period. FIG. 1 shows a slice of a trellis that illustrates a single butterfly. Two input states 10 and 20, at time k, connect to a corresponding pair of states, 30 and 40, at time k+1, via opposing pairs of paths 12, 14 and 22, 24, respectively. Input state 10 corresponds to a path metric for state a at time k, and has two branch metrics 12 and 14. The branch metrics 12, 14 are dependent on parity data, extrinsic information and respective input symbols, 0 and 1. A path metric is a measure of the probability of a particular state based on past received symbols, whilst each branch metric reflects the probability that a current path between two states is correct.

The branch metrics 12,14 connect the input state 10 to possible states in the trellis at time k+1. Branch metric 12 terminates at next state 30, being the path metric for state m at time k+1. Branch metric 14 terminates at next state 40, being the path metric for state n at time k+1. Similarly, input state 20 corresponds to a path metric for state b at time k and has branch metrics 22 and 24, which are dependent on parity data, extrinsic information and respective input symbols of 0 and 1. Branch metric 22 terminates at next state 30 and branch metric 24 terminates at next state 40, at time k+1. Thus, for any given path metric at time k, there are two possible branch metrics, corresponding to input symbols of 0 and 1, leading to two possible new states at time k+1. Moreover, pairs of input states at time k are connected to corresponding pairs of states at time k+1 by opposing branch metrics, demonstrating the symmetry of the trellis.

A core component for implementing such trellis-based algorithms is an add-compare-select (ACS) unit, which approximates trellis state probability calculations in the log domain. The trellis butterfly calculation is performed using two interconnected ACS units, each ACS unit being fed two competing path metrics computed using previous path metrics and current branch metrics. The ACS unit selects the greater of the two competing path metrics as a maximum path metric, which is then normalized and corrected to produce a new path metric. The same technique may be used to select a minimum path metric to produce a new path metric.

As the ACS unit performs a log approximation, hardware implementations of the log MAP algorithm use a lookup table to add a corrective factor, based on the difference of the incoming path metrics, to compensate for the maximum approximation. The operation can be summarized as follows, where $PM_{sx}$ represents the path metric (PM) for state x and $BM_y$ represents the branch metric (BM) for path y (either path 0 or 1) at time index k:

$$x_1 = PM_{s0}[k] + BM_0[k] \text{ and } x_2 = PM_{s1}[k] + BM_1[k]$$

$$PM_{sx}[k+1] = \max[x_1, x_2] + f[|x_1 - x_2|]$$

A traditional method of implementing an add-compare-select (ACS) unit for butterfly processing follows directly from the equation specified above. FIG. 2 demonstrates a typical block diagram for a prior art ACS unit. Initially, two competing paths are computed from the previous path metrics and the current branch metrics using an adder circuit. There are many techniques to accelerate the addition process such as carry-look-ahead adders and prefix adders, but the propagation delay still depends on fully propagating the carry to compute the final result.

For a given time period, path metric-0 201 and a corresponding branch metric-0 202 are presented to a first adder 210 to produce a first competing path 211. Path metric-1 203 and corresponding branch metric-1 204 are presented to a second adder 212 to produce a second competing path 213. The competing paths 211 and 213 are presented to each of a multiplexer 214 and a subtracter 216. The two competing paths 211, 213 are subtracted to determine which of the two competing paths is the maximum path metric value. Accordingly, the subtracter 216 produces a most significant bit 217, which represents the sign of the difference between the two competing path metrics 211, 213 and, thus, which of the two competing path metrics is greater. The most significant bit 217 is presented as a select bit for the multiplexer 214, and the greater of the two competing path metrics is output from the multiplexer 214 as the maximum path metric 215. Alternate embodiments utilize the most significant bit 217 to select a minimum path metric. The subtracter 216 also produces the difference 219, which is presented to a lookup table 218.

The lookup table (LUT) 218 uses the difference 219 to produce a corrective factor 223. The LUT simply approximates the correction factor, which is a function of the absolute value of the difference between the two competing paths:

$$f[|x_1-x_2|]=\ln(1+e^{|x_1-x_2|}).$$

The maximum path metric 215 is presented to a third adder 220, which also receives an external normalization factor 222. The normalization factor 222, which is typically a negative value, and the maximum path metric 215 are added to ensure that the maximum value 215 remains within the dynamic range of the ACS unit. Path metric values tend to grow continuously with recursive ACS processing, and the dynamic range of the path metric variables can grow quite large, even for moderate size blocks. Fortunately, the values of path metrics only have meaning relative to the other states within the same time index, so a normalization term is applied to prevent the path metrics from growing too large. The dynamic range of the path metric values is quantized to handle only a small block of trellis, providing the normalization factor is equally applied to all states to periodically reduce the magnitudes of the path metric values.

The third adder 220 produces a normalized output 221, which is added to the corrective factor 223 using a fourth adder 224. The fourth adder 224 produces an output 226, which is the new path metric for the next time period. The critical calculation pipeline for such an algorithm, i.e., the pipeline path that limits the calculation speed, is formed from at least 4 adders in series, or 3 adders and a look-up table (LUT), depending on the propagation delay of the LUT.

Carry-save arithmetic is a known technique in which a result is presented as separate carry and sum components, rather than the more conventional single number resolved output. FIG. 3a shows a known implementation of a 3:2 compressor 300 using a full adder. The 3:2 compressor 300 receives three inputs A-302, B-304 and C-306 and produces a sum 308 and a carry 310. FIG. 3b shows the truth table for the 3:2 compressor 300 of FIG. 3a. It is evident from the truth table 315 that the sum 308 plus twice the carry 310 provides the sum A+B+C.

For example, if one of the three inputs A,B,C is equal to 1, with the other inputs being 0, the carry is 0 and the sum is 1, representing a result of 1. Similarly, if two of the inputs are 1 with the remaining input being 0, the carry is 1 and the sum is 0, yielding a result of 2. Finally, if each of the inputs is 1, the carry is 1 and the sum is 1, representing a result of 3. Thus, the 3:2 compressor 300 is able to represent the values of the three inputs 302, 304 and 306 in the carry-save format using two components 308 and 310.

FIG. 3c shows a known implementation of a 4:2 compressor 320 using two full adders 316, 318 that have been cascaded. The 4:2 compressor 320 receives inputs 322, 324, 326 and 328, along with a carry-in 329. The 4:2 compressor 320 produces sum and carry outputs 330 and 332, respectively, and a carry-out 327. Three inputs 322, 324 and 326 are presented to the first full adder 316. The first full adder 316 produces a sum 325 and the carry-out 327. The sum 325 and the fourth input 328 are presented to the second full adder 318, along with the carry-in 329. The carry-out 327 is decoupled from the carry chain and is presented as an output of the 4:2 compressor 320. The carry-out 327 may be used as a carry-in for a cascaded 4:2 compressor. The second full adder 318 adds the sum 325 and the fourth input 328, utilizing the carry-in 329, to produce the sum 330 and the carry 332. The sum 330 and carry 332 represent the sum of the four inputs 322, 324, 326 and 328. Decoupling the carry chain results in the carry-out 327 of the 4:2 compressor 320 being independent of the carry-in 329. Thus, the carry-out 327 is dependent only on the three inputs 322, 324 and 326, resulting in a faster embodiment of a 4:2 compressor 320.

Since the trellis butterfly calculation is placed on the tight inner loop of trellis algorithms, the overall performance of the trellis butterfly calculation dictates the critical path, i.e., the path that limits the calculation speed. Consequently, every effort spent on optimizing the ACS unit will translate directly to performance gains in the trellis processing algorithm. For example, the correction factor term in log MAP is an essential component of the ACS unit because it has a significant impact on algorithm performance, and in the case of turbo decoding, the correction factor contributes a 0.3 dB performance gain over the max-log MAP algorithm.

SUMMARY OF THE INVENTION

In accordance with the principles of the present invention, a method and apparatus for performing add-compare-select processing are provided. The method and apparatus utilize carry-save arithmetic to accelerate the production of new path metrics. As indicated, carry-save arithmetic presents a value as two constituent sum and carry components.

More specifically, first and second path metrics in carry-save format and first and second branch metrics are presented. The first path metric is added to the first branch metric to produce a first competing path metric in carry-save format. Similarly, the second path metric and second branch metric are added to produce a second competing path metric in carry-save format. The first and second competing path metrics are compared and, on the basis of the comparison, one of the first and second competing path metrics is chosen as a desired maximum or minimum new path metric. The new path metric is presented as an output in carry-save format, and is thus able to be presented recursively as a new input for a subsequent iteration of a decoding process.

BRIEF DESCRIPTION OF THE DRAWINGS

The present invention will be better understood from reading the following description of non-limiting embodiments, with reference to the attached drawings, wherein below:

FIG. 3(a) is a block diagram representation of a prior art implementation of a 3:2 compressor, while FIG. 3(b) is a truth table for the 3:2 compressor of FIG. 3(a)

Figure 1:
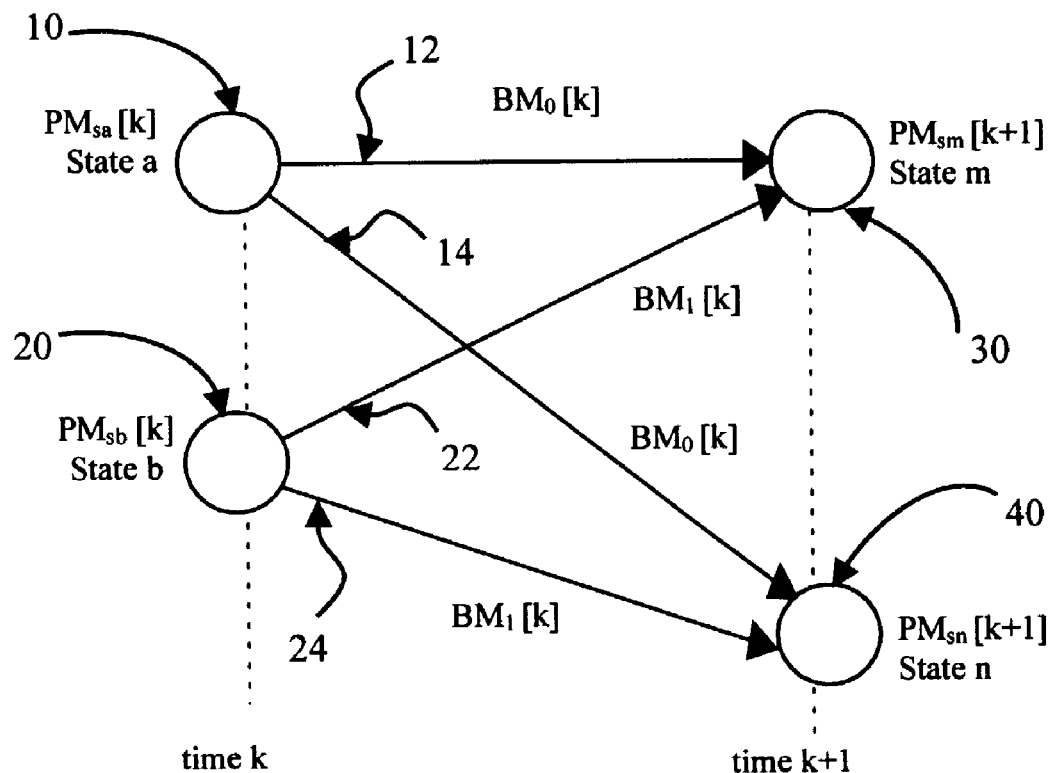
FIG. 1 is a block diagram representation of a slice of a decoding trellis.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

Where reference is made in any one or more of the accompanying drawings to steps and/or features, which have the same reference numerals, those steps and/or features have for the purposes of this description the same function(s) or operation(s), unless the contrary intention appears.

In accordance with an embodiment of the present invention, an ACS unit is implemented which uses outputs arranged in carry-save format and advantageously uses data compressors that operate based upon carry-save principles. Carry-save arithmetic is fast as the components may be utilized to render the correct result without being resolved into intermediate results.

In order to speed-up the selection of a maximum or minimum path, the computation of two competing paths is delayed and only the difference is computed directly. The three inputs for each path are compressed using a 3:2 compressor, and one path is subtracted from the other using 2's complement arithmetic on the carry-save components. The normalization value is added, and the output is left in carry-save format. The carry-save components are truncated and passed to the next cycle of ACS processing. The key to truncating the values is to guarantee that the final result has less precision than the truncated values, even if the carry-save components are larger than the truncated value.

Figure 4:
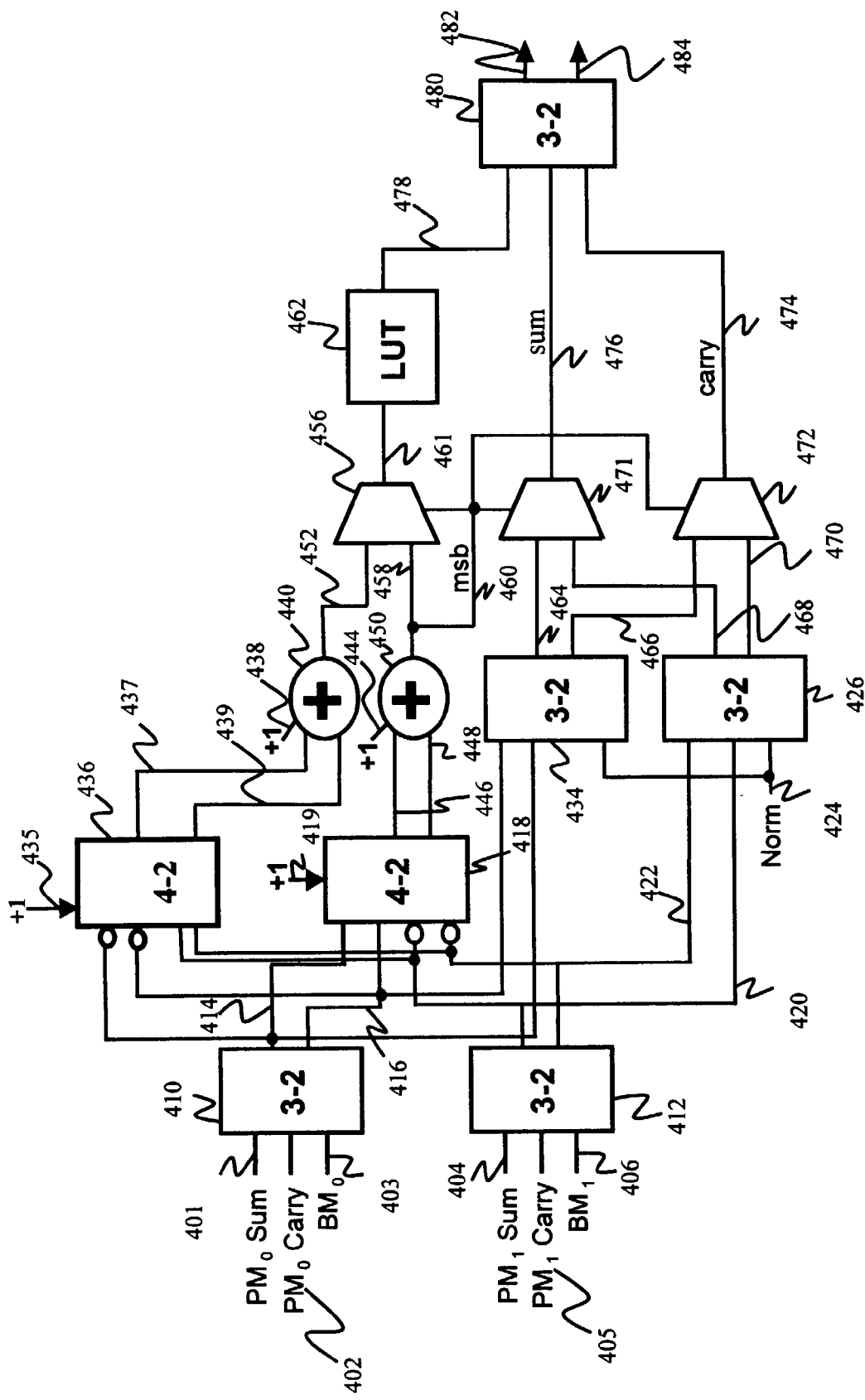
FIG. 4 is a block diagram representation of a carry-save ACS unit in accordance with an embodiment of the invention.

FIG. 4 shows a block diagram schematic representation of a carry-save ACS unit 400 in accordance with an embodiment of the present invention. A first 3:2 compressor 410 receives a branch metric-0 403 and a path-matric-0 in carry-save format, represented by path metric-0 sum 401 and path metric-0 carry 402. The 3:2 compressor 410 adds the three inputs 401, 402, 403 and produces p0_sum 414 and p0_carry 416. P0_sum 414 and p0_carry 416 represent a first competing path metric, being the equivalent of the first competing path metric 211 in FIG. 2.

A second 3:2 compressor 412 receives a branch metric-1 406 and a path metric-1 in carry save format, represented by path metric-1 sum 404 and path-1 carry 405. The second 3:2 compressor 412 produces p1_sum 420 and p1_carry 422, representing the second competing path metric, being the equivalent of the second path metric 213 from FIG. 2.

Figure 2:
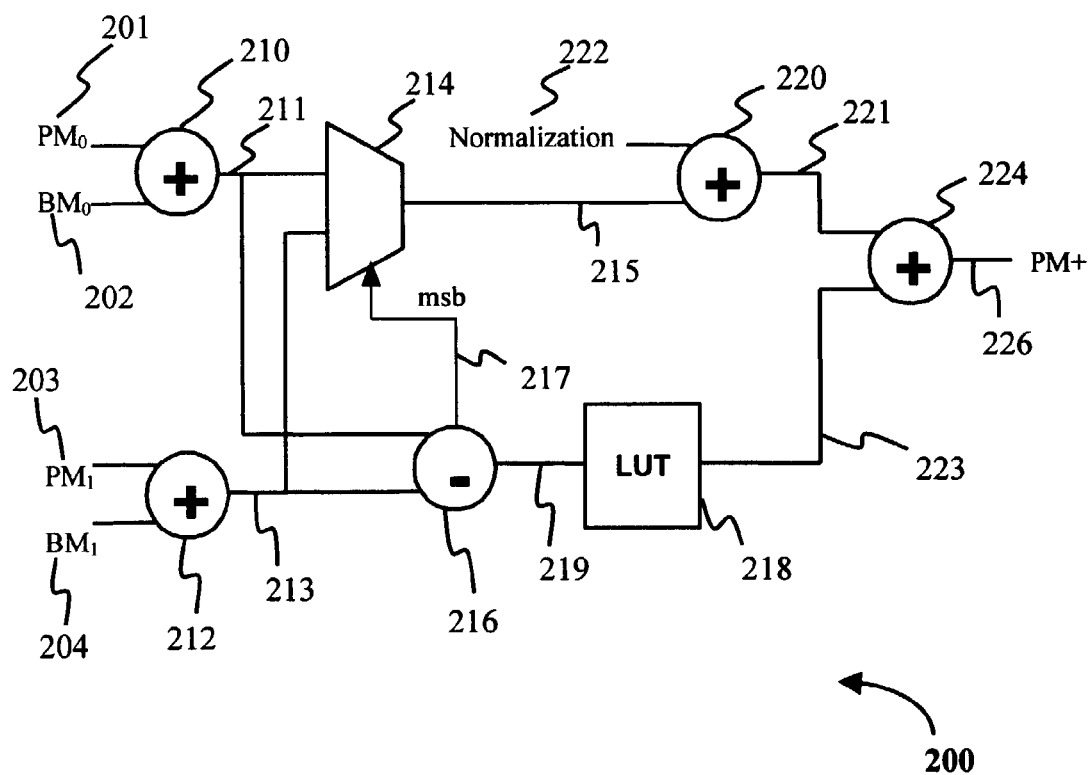
FIG. 2 is a block diagram representation of a prior art implementation of an ACS unit.
Figures 3A, 3B:
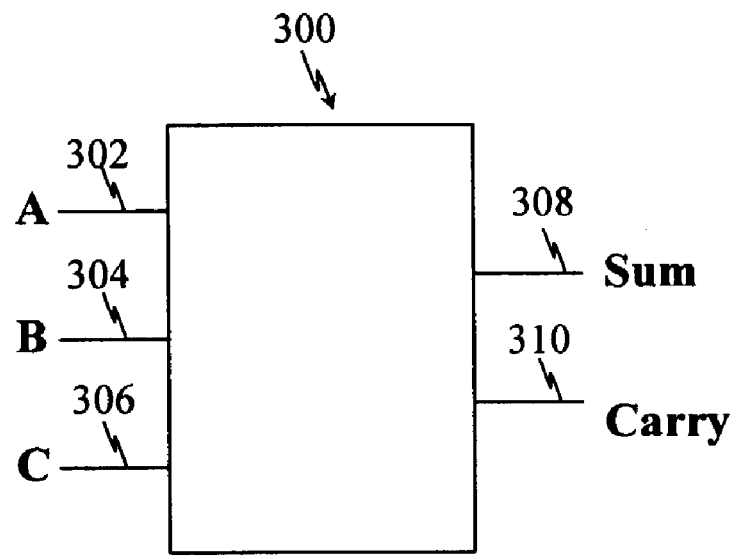
Figure 3C:
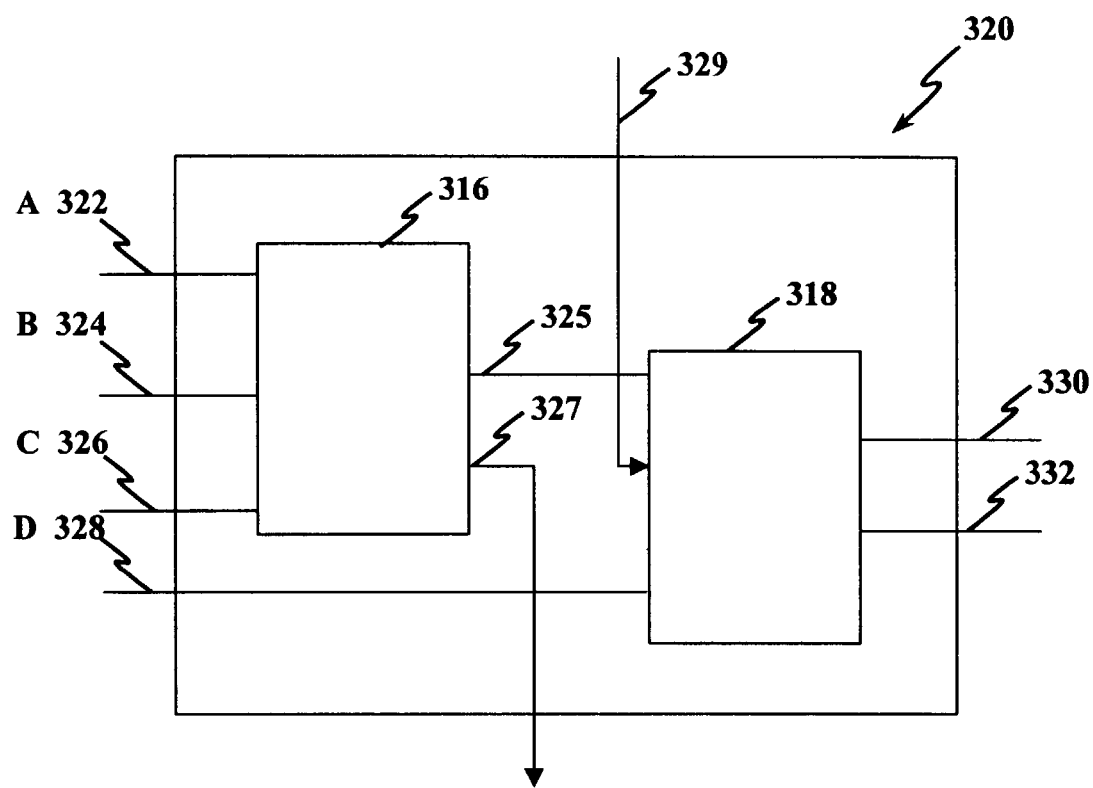
FIG. 3(c) is a schematic block diagram representation of a prior art implementation of a 4:2 compressor.

A LUT 462, being equivalent to the LUT 218 of FIG. 2, requires the absolute value of the difference between the two competing path metrics to produce a corrective factor. In order to compute the absolute value with minimum delay, two 4:2 compressors are used to compute the difference between the two competing path metrics and then the most significant bit is used to select the positive difference to be used as the absolute value required by the LUT 462.

The p0_sum 414 and p0_carry 416 and the inverse of each of p1_sum 420 and p1_carry 422 are presented as inputs to a first 4:2 compressor 418. The first 4:2 compressor 418 also receives a first +1 factor 419. The first +1 factor 419 acts as a carry-in and is used to correct, in 2s complement, the inverse of p1_sum 420. The first 4:2 compressor 418 adds the first competing path metric with the inverse of the second competing path metric to determine which of the competing path metrics is greater. Accordingly, the 4:2 compressor 418 produces a diff_sum 446 and a diff_carry 448 representing the difference of the competing path metrics.

The diff_sum 446 and diff_carry 448 are presented to a first adder 450, along with a second +1 factor 444. The second +1 factor 444 is used to correct, in 2s complement, the effect of inverting p1_carry 422. The first adder 450 adds the sum and carry components of the difference, along with the second +1 factor 444, to produce a first resolved difference 458, which may be positive or negative. The first resolved difference 458 is presented to a first multiplexer 456 and the most significant bit 460 of the first resolved difference 458 is presented to each of the first multiplexer 456, a second multiplexer 471 and a third multiplexer 472 as respective select inputs.

A second 4:2 compressor 436 is used with the inverted partial products received by the first 4:2 compressor 418 to compute the negative of the difference of the two competing path metrics. Accordingly, the second 4:2 compressor 436 receives p1_sum 420 and p1_carry 422, and the inverse of p0_sum 414 and p0_carry 416. The second 4:2 compressor 436 also receives a third +1 factor 435, which acts in the same manner as the first +1 factor 419 to correct the inverse of p0_sum 414. The second 4:2 compressor 436 produces a sum 437 and a carry 439, which are presented to a second adder 440. The second adder 440 adds the sum 437 and the carry 439, utilizing a fourth +1 factor 438, to produce a second resolved difference 452, which is presented to the first multiplexer 456. Thus, the first multiplexer 456 receives first and second resolved differences 458 and 452 representing the first competing path metric minus the second competing path metric, and the second competing path metric minus the first competing path metric, respectively. Computing the first and second resolved differences 458 and 452 in parallel is faster than computing a single resolved difference and then negating the value to obtain the other resolved difference.

The most significant bit 460 acts as a select input to choose the absolute value 461 of the difference of the two competing path metrics. The absolute value 461, being equivalent to the difference 219 in FIG. 2, is presented to a lookup table 462 to produce a corrective factor 478, which is equivalent to the corrective factor 223 in FIG. 2.

Figure 5:
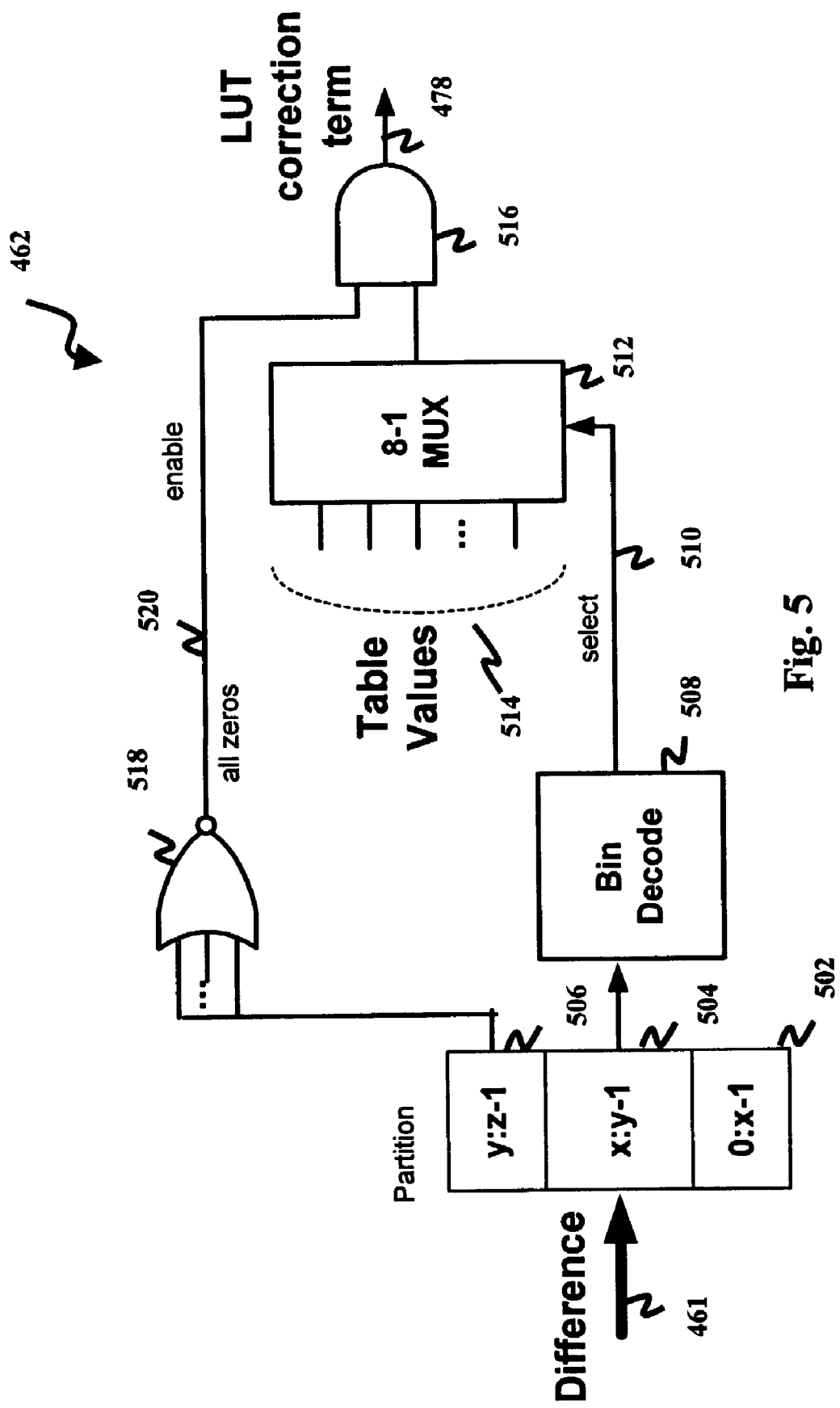
FIG. 5 is a block diagram representation of an implementation of the look-up table (LUT) of FIG. 4.

FIG. 5 shows an implementation of the LUT 462 that slices the absolute value of the difference into bins, which then select the appropriate correction factor. The absolute value 461 is partitioned into 3 sections: the lower bits 502 are ignored, the middle bits 504 are used to detect the bin entry, and the upper bits 506 are used to ensure the entry is within the range of the table. The number of bits that are truncated, x, determines the minimum size of the bins, as the bin size is $2^x$. A bin decode block 508 is configured to map multiple bins of size $2^x$ into single correction factors for better log MAP performance. The middle bits 504 are presented to the bin decode block 508, which maps the middle bits 504 into a select value 510 for an eight-to-one multiplexer 512. The multiplexer 512 selects a stored table value 514 and presents an output to an AND gate 516.

The upper bits 506 are presented as individual inputs to a NOR gate 518 to produce an enable signal 520. Hence, the enable signal 520 will only be enabled when all of the upper bits 506 are zeros. The enable signal is presented to the AND gate 516, which produces an output being the LUT corrective factor 478. If any one of the upper bits 506 is not a zero value, the input difference 461 is outside the range of the table 462 and, consequently, the enable signal 520 is not enabled and the corrective factor 478 will be zero. Returning to FIG. 4, the corrective factor 478 is presented to a third 3:2 compressor 480.

The p1_sum 420 and p1_carry 422 are presented to a fourth 3:2 compressor 426, which also receives a normalization factor 424 as an input. The fourth 3:2 compressor 426 adds the components 420, 422 of the second competing path metric to the normalization factor 424 to produce a first normalized sum 468. The normalized sum is presented as an input to the second multiplexer 471. The fourth 3:2 compressor 426 also produces a normalized carry 470, which is presented to the third multiplexer 472.

Similarly, a fifth 3:2 compressor 434 receives p0_sum 414, p0_sum 416 and the normalization factor 424. The fourth 3:2 compressor 434 presents a normalized sum 464 to the second multiplexer 471 and a normalized carry 466 to the third multiplexer 472. Therefore, the second multiplexer 471 receives the normalized sums 464, 468 of the respective competing path metrics and the third multiplexer 472 receives the normalized carry components 466, 468 of the respective competing path metrics. Subsequently, the second multiplexer 471 produces a normalized sum 476 representing the normalized sum of the maximum of the two competing path metrics, as determined by the sign of the difference of the two competing path metrics, embodied by the most significant bit 460. Similarly, the third multiplexer 472 produces a normalized carry 474 representing the normalized carry component of the maximum path metric. Together, the normalized sum 476 and normalized carry 474 are equivalent to the normalized output 221 of FIG. 2.

FIG. 4 shows each of the branch metric-0 403, branch metric-1 406 and normalization factor 424 in resolved format. It is also possible to utilise the respective branch metrics 403, 406 and normalization factor 424 if presented in carry-save format. There does not appear to be an apparent advantage in doing so, as the respective 3:2 compressors 410, 412 and 426 would have to be replaced by more computationally intensive 4:2 compressors to receive the carry-save components.

The third 3:2 compressor 480 receives the corrective factor 478, the normalized sum 476 and the normalized carry 474 to produce a new path metric sum 482 and a new path metric carry 484 for the next time period, being equivalent to new path metric 226 of FIG. 2. Hence, in accordance with an embodiment of the invention, it is possible to present path metrics in a carry-save format and perform ACS unit calculations to produce a new path metric in carry-save format without having to perform extra calculations required by conventional techniques to reduce the path metrics to the more usual resolved format.

In order to speed-up the selection of the maximum path, the resolution of the two competing paths is delayed and only the difference is computed directly using first and second adders 440 and 450. The three inputs for each path metric are compressed using 3:2 compressors 410, 412 and one path metric is subtracted from the other using 2's complement arithmetic on the carry-save components (inverting both values and adding +2). After each of the first and second 3:2 compressors 410 and 412, only a single adder circuit, 440 and 450, respectively, is required to compute the difference between the two competing path metrics, and hence, the maximum of the two. The propagation delay up to the adder stage is only three, single-bit full adder cells regardless of the bit width of incoming components. At the adder stage, the maximum component must be selected and consequently this is the one place in the ACS unit in which the carry-save components must be resolved.

At the same time that the maximum selection is calculated, the normalization factor is added to previous path metric products. Finally, when the difference has been calculated, the appropriate sum and carry partial products are combined with the correction term from the LUT using a 3:2 compressor. The outputs of the carry-save ACS unit are the sum and carry components.

The ability to accumulate carry-save values is important to the implementation of carry-save arithmetic within an ACS unit. This is particularly difficult as 3:2 compressors and 4:2 compressors create output vectors, which are wider than the input vectors. Thus, to feed an output back to another ACS unit, the output values must be truncated.

A simple 3:2 compressor with n-bit wide inputs creates two output vectors, each being n+1 bits wide, the sum of which represents the output value. In order to accumulate the carry-save values, two partial products must be recursively presented to the inputs of the 3:2 compressor, but each of the partial products must be truncated back to n bits. However, truncating the partial products to n bits constitutes a potential loss of information from the carry-save components, since the individual values can be larger than the sum of the two components. If the final value is less than n bits, the upper bits simply represent the sign propagation and can, therefore, be truncated without error.

Figure 6:
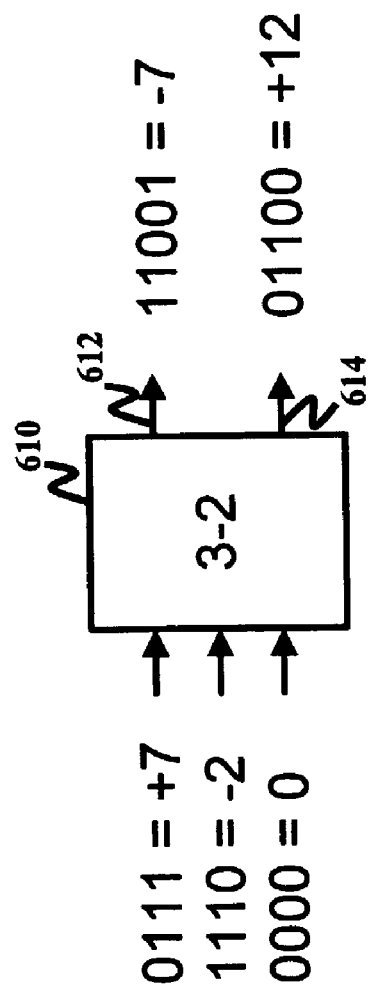
FIG. 6 is an example of truncation using carry-save arithmetic.

Consider the example of FIG. 6, in which truncation is accomplished. When three 4-bit values, +7, -2 and 0, are added together using a 3:2 compressor 610, the two resulting partial products 612, 614 represent the final value of 5 with -7 and +12, respectively. If the values of the partial products 612, 614 are truncated back to 4-bits, represented by the values 622 and 624, respectively, the two results in themselves no longer make sense (the two values become -7 and -4). Truncated carry-save is possible by adding the terms 622, 624 together, and then only considering the lower 4 bits of the result 626, which in this example renders the correct sum of +5.

In the traditional sense of computer arithmetic, adding these components would indicate an overflow. In essence, by truncating the carry save components, the arithmetic overflow may be used to compute the final value. Once truncated terms are injected into carry-save trees, it is important not to use the truncated values to generate numbers larger than n bits.

Trellis-based algorithms using ACS units are recursively based. Truncated carry-save enables the carry-save components of the output of the ACS unit to be presented as recursive inputs to the ACS unit. It is possible to delay the final resolution of the carry-save components by one cycle, using the partial products to commence the next stage of trellis processing.

Figure 7:
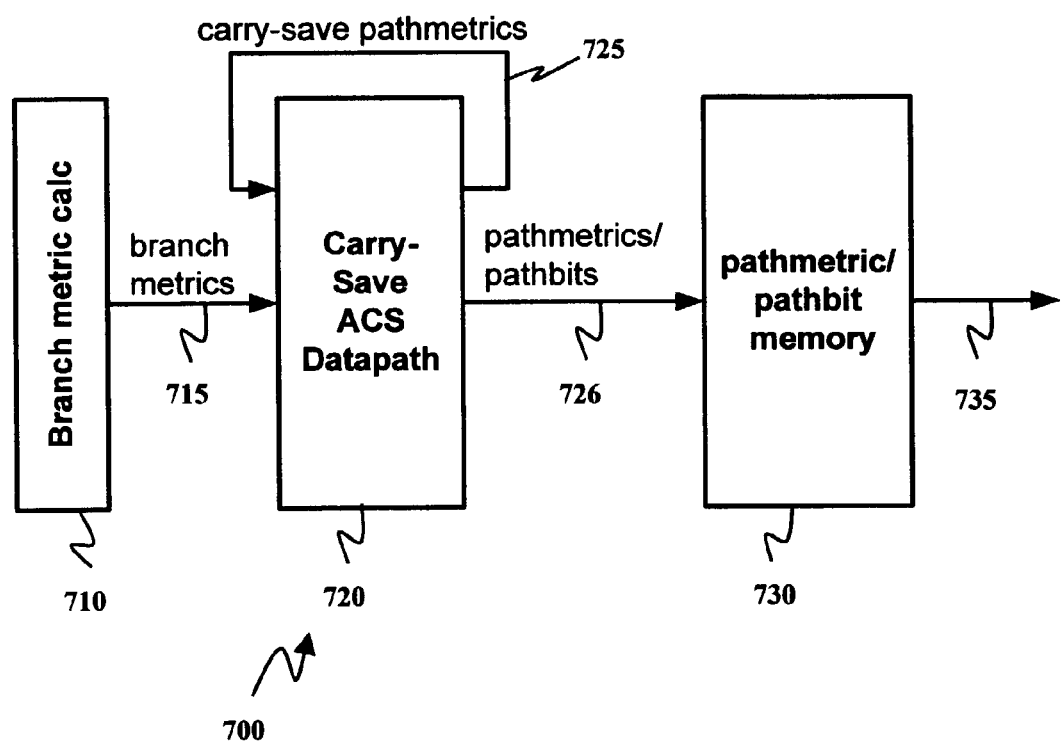
FIG. 7 is a block diagram representation of an arrangement for delayed carry resolution for use in either one of a MAP or Viterbi decoder implementing carry-save arithmetic.

FIG. 7 shows an arrangement 700 for delayed carry resolution, in accordance with an embodiment of the present invention, for either one of a MAP or Viterbi decoder implementing carry-save arithmetic. A branch metric calculator 710 presents branch metrics 715 to a carry-save ACS data path 720. The carry-save ACS data path 720 utilizes the branch metrics 715 in combination with recursive carry-save path metrics 725 to produce an output 726 and the recursive carry-save path metrics 725 for the next iteration. When the arrangement 700 is being utilized in a MAP decoder, the output 726 represents new path metrics. When the arrangement 700 is being utilized in a Viterbi decoder, the output 726 represents single bit path decisions. The output 726 is presented to a memory unit 730, which produces a decoded output 735.

Figure 8:
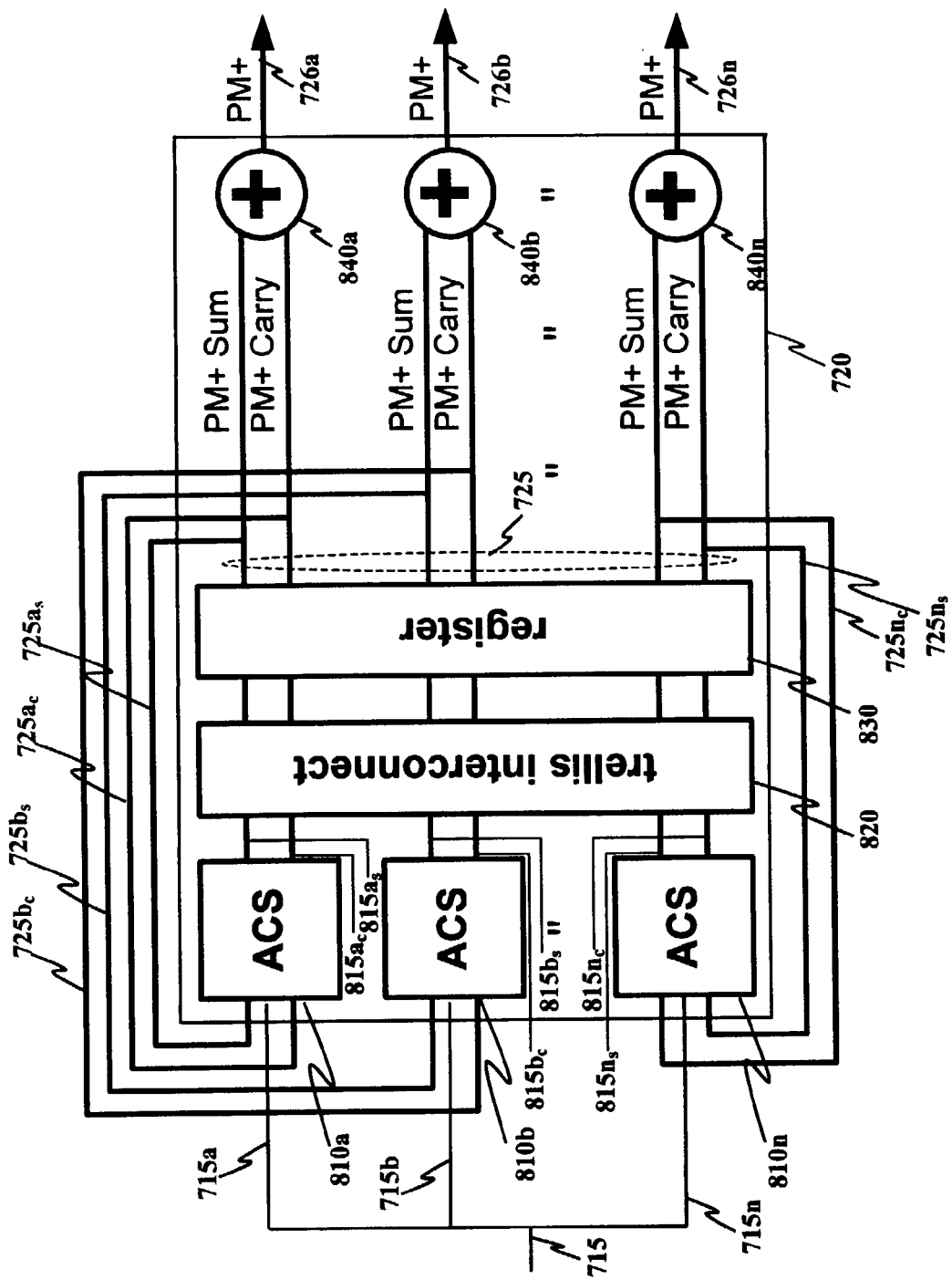
FIG. 8 is a block diagram representation of an implementation of the carry-save ACS data path of FIG. 7.

FIG. 8 shows an implementation of the carry-save ACS data path 720 of FIG. 7. A bank of ACS units $810a \ldots 810n$ is provided in the carry-save ACS data path 720. Each of the ACS units $810a \ldots 810n$ receives a corresponding pair of branch metrics $715a \ldots n$. ACS unit $810a$ also receives a path metric having a sum component $725a_s$, and a carry component $725a_c$, corresponding to the recursive carry-save path metrics 725 of FIG. 7. Similarly, each of the ACS units $810b \ldots 810n$ receives a corresponding pair of sum and carry components $(725b_s, 725b_c) \ldots (725n_s, 725n_c)$.

ACS unit $810a$ utilizes the received pair of branch metrics $715a$ and carry-save path metric pair $725a_s, 725a_c$ to produce a new path metric having a sum component $815a_s$ and a carry component $815a_c$. Similarly, ACS units $810b \ldots 810n$ produce corresponding new path metric pairs $(815b_s, 815b_c) \ldots (815n_s, 815n_c)$. Each of the new path metric pairs $(815a_s, 815a_c) \ldots (815n_s, 815n_c)$ is presented to a trellis interconnect module 820. The trellis interconnect module 820 reorders the new path metric pairs $(815a_s, 815a_c) \ldots (815n_s, 815n_c)$ in accordance with a predetermined sequence and stores reordered path metric pairs $(825a_s, 825a_c) \ldots (825n_s, 825n_c)$ in a register 830.

In a subsequent iteration, the reordered path metrics are output from the register 830 as recursive path metric pairs $725a_s, 725a_c \ldots 725n_s, 725n_c$. In addition to being presented to corresponding ACS units $810a \ldots 810n$, each of the recursive path metric pairs $725a^s, 725a_c \ldots 725n_s, 725n_c$ is presented to a corresponding adder $840a \ldots 840n$. Thus, the adder $840a$ receives the recursive path metric pair $825a_s, 825a_c$ and produces a resolved output, being new path metric $726a$. Similarly, the adders $840b \ldots 840n$ produce corresponding new path metrics $726b \ldots 726n$.

In accordance with an embodiment of the present invention, an ACS unit implementing carry-save arithmetic replaces many traditional components with 3:2 compressors and 4:2 compressors. 3:2 compressors and 4:2 compressors have propagation delays proportional to one full adder cell and two full adder cells, respectively, regardless of bit width. Truncating outputs of the 3:2 compressors and 4:2 compressors whilst retaining the accuracy of the outputs enables carry-save components to be utilized in recursive trellis-based algorithms without exceeding the dynamic range of the ACS units. When path metric values are stored in a traceback memory, resolving the carry-save representation into a single value significantly reduces the memory requirements by half, as it is no longer necessary to store carry-save components individually.

After the compressors, only a single adder circuit is required to compute the difference between the two paths, and hence the maximum of the two. Thus, a full adder may be removed from the output of the ACS unit. An ACS unit implementing carry-save arithmetic may be used to significantly accelerate the calculation of path metric values, provided the values do not overflow. The prevention of overflow is guaranteed through the use of normalization.

It is apparent from the above that the arrangements described are applicable to the telecommunications industry.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, the method, system and portions thereof and of the described method and system may be implemented in different locations, such as a wireless unit, a base station, a base station controller, a mobile switching center and/or a radar system. Moreover, processing circuitry required to implement and use the described system may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention It is therefore contemplated that the appended claims will cover any such modifications or embodiments as fall within the true scope of the invention.

The invention claimed is:

1. A method of performing add-compare-selection, the method comprising:
   providing first and second path metrics in carry-save format having respective sum and carry components;
   producing first and second competing path metrics in carry-save format having sum and carry components in response to the first and second branch metrics;
   presenting the sum and carry components of the first competing path metric and the inverse of the sum and carry components of the second competing path metric to determine a first difference having sum and carry components;
   presenting the inverse of the sum and carry components of the first competing path metric and the sum and carry components of the second competing path metric to determine a second difference having sum and carry components;
   adding respective sum and carry components of the first and second differences to produce respective first and second resolved differences;
   presenting the carry and save components of the first competing path metric and a normalization factor to produce a normalized sum and a normalized carry for the first competing path metric;
   presenting the carry and save components of the second competing path metric and the normalization factor to produce a normalized sum and a normalized carry for the second competing path metric;
   selecting the normalized sum and normalized carry corresponding to one of the competing path metrics;
   providing one of the first and second differences, as determined by the sign of the first resolved difference, as an absolute value to produce a corrective factor; and
   presenting the selected normalized sum, selected normalized carry and said corrective factor to produce sum and carry components of a new path metric.

2. The method according to claim 1, wherein the determination of the first and second differences occurs in parallel and the production of first and second resolved differences occurs in parallel.

3. The method of claim 1, wherein the step of providing one of the first and second differences comprises:
   partitioning the absolute value into upper bits, middle bits and lower bits; mapping the middle bits to a stored corrective value; and
   enabling the stored corrective value as the corrective factor if the upper bits are equal to zero.

4. An apparatus for performing add-compare-select processing comprising:
   at least one processing unit for comparing at least a two competing path metrics in carry save format to generate at least a maximum and/or a minimum path metric in carry-save format;
   first and second 3:2 compressors for receiving respective first and second path metrics having sum and carry components and respective first and second branch metrics, and for producing a first competing path metric having sum and carry components and a second competing path metric having sum and carry components, respectively;
   a first 4:2 compressor for receiving the sum and carry components of the first competing path metric and inverted sum and carry components of the second competing path metric to produce a first difference having sum and carry components;
   a second 4:2 compressor for receiving said sum and carry components of the second competing path metric and inverted sum and carry components of the first competing path metric to produce a second difference having sum and carry components;
   a third 3:2 compressor for receiving arranged to receive the sum and carry components of the first competing path metric and a normalization factor, and for producing a first normalized sum and a first normalized carry corresponding to the first competing path metric; and
   a fourth 3:2 compressor for receiving the sum and carry components of the second competing path metric and the normalization factor, and for producing a second normalized sum and a second normalized carry corresponding to said second competing path metric.

5. The apparatus of claim 4, further comprising:
   a first adder for receiving the sum and carry components of the first difference to produce a first resolved difference;
   a second adder for receiving the sum and carry components of the second difference to produce a second resolved difference;
   a first multiplexer for receiving the first and second resolved differences as inputs and the most significant bit of the first resolved difference as a select input, for indicating which of the first and second resolved differences is positive, and for outputting whichever of the first and second resolved differences is positive as an absolute difference;

a lookup table configured to receive said absolute difference and to produce a corrective factor;

a second multiplexer for receiving the first and second normalized sum components of the first and second competing path metrics, respectively, for receiving the most significant bit of the first resolved difference as a select input, and for producing a maximum sum corresponding to the normalized sum of the greater of the two competing path metrics;

a third multiplexer for receiving the first and second normalized carry components of said first and second competing path metrics, respectively, for receiving the most significant bit of the first resolved difference as a select input, and for producing a maximum carry corresponding to the normalized carry of the greater of the two competing path metrics; and a fifth 3:2 compressor for receiving the corrective factor, the maximum sum and the maximum carry and for producing a new path metric having sum and carry components.

6. The apparatus of claim 5, wherein the first and second 4:2 compressors are configured to operate in parallel.

7. The apparatus of claim 5, wherein the first and second adders are configured to operate in parallel.

\* \* \* \* \*